(12) United States Patent
Moon

(10) Patent No.: US 7,486,269 B2
(45) Date of Patent: Feb. 3, 2009

(54) SHIFT REGISTER, SCAN DRIVING CIRCUIT AND DISPLAY APPARATUS HAVING THE SAME

(75) Inventor: Seung-Hwan Moon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 638 days.

(21) Appl. No.: 10/865,216

(22) Filed: Jun. 10, 2004

(65) Prior Publication Data

US 2005/0008114 A1  Jan. 13, 2005

(30) Foreign Application Priority Data

Jul. 9, 2003  (KR) .................... 10-2003-0046503
Oct. 20, 2003  (KR) .................... 10-2003-0072889

(51) Int. Cl.
*G09G 3/36* (2006.01)
(52) U.S. Cl. .......................... 345/100; 345/98
(58) Field of Classification Search .......... 345/98, 345/99, 100; 377/64, 72, 78
See application file for complete search history.

(56) References Cited

U.S. PATENT DOCUMENTS

| 6,300,928 | B1* | 10/2001 | Kim ........................ 345/92 |
| 6,556,646 | B1* | 4/2003 | Yeo et al. .................. 377/54 |
| 6,789,514 | B2 | 9/2004 | Suh et al. |
| 7,042,430 | B2* | 5/2006 | Isami et al. ................. 345/89 |

* cited by examiner

*Primary Examiner*—Amr Awad
*Assistant Examiner*—Randal Willis
(74) *Attorney, Agent, or Firm*—Cantor Colburn LLP

(57) ABSTRACT

A shift register includes a plurality of stages to generate a plurality of output signals, in sequence. Each of the stages includes a driving circuit, a charging circuit, a discharging circuit and a holding circuit. The driving circuit is configured to generate a first output signal in response to a first clock signal or a second clock signal having a phase different from the first clock signal. The charging circuit is configured to charge an electric charge in response to a scan start signal or a second output signal of an adjacent previous stage. The discharging circuit is configured to discharge the electric charge in response to a third output signal of an adjacent next stage. The holding circuit is configured to maintain the first output signal within a first voltage when the first output signal is in an inactive state. Therefore, a parasite capacitance is decreased to prevent a floating of a pull-up transistor.

43 Claims, 9 Drawing Sheets

SHIFT REGISTER, SCAN DRIVING CIRCUIT AND DISPLAY APPARATUS HAVING THE SAME

CROSS-REFERENCE OF RELATED APPLICATIONS

The present application claims priorities from Korean Patent Application No. 2003-46503, filed on Jul. 9, 2003 and Korean Patent Application No. 2003-72889, filed on Oct. 20, 2003, the disclosure of which is hereby incorporated herein by reference in their entireties.

BACKGROUND OF THE INVENTION

1. Field of the Invention

The present invention relates to a shift register, a scan driving circuit having the shift register and a display apparatus having the shift register.

2. Description of the Related Art

A data driver integrated circuit or a gate driver integrated circuit may be integrated into a liquid crystal display (LCD) panel so as to decrease a manufacturing cost and a size of an LCD apparatus. In order to integrate the driver integrated circuits, a scan driving circuit of the LCD panel has a simplified structure.

The scan driving circuit includes a shift register to generate a gate pulse, and applies the gate pulse to a gate line of the LCD panel. A unit stage of the shift register includes a set-reset (S-R) latch and an AND gate.

When a first input signal that is outputted from an adjacent previous stage is applied to the S-R latch, the S-R latch is activated. When a second input signal that is outputted from an adjacent next stage is applied to the S-R latch, the S-R latch is deactivated. When the S-R latch is activated and a first clock signal has a high level, the AND gate generates a gate pulse. The gate pulse outputted from a present stage may be a scan signal.

The first clock signal and a second clock signal that has an opposite phase to the first clock signal are applied to the unit stage of the shift register.

The unit stage, generally, includes a buffer, a charging circuit, a driving circuit and a discharging circuit. The present stage outputs a gate signal or the scan signal in response to a scan start signal or an output signal of the adjacent previous stage.

The buffer includes a first transistor. A gate electrode of the first transistor is electrically connected to a drain electrode of the first transistor. A source electrode of the first transistor is electrically connected to a first end of the charging circuit. The first input signal (IN1) is applied to the drain electrode of the first transistor. The charging circuit includes a capacitor. The first end of the capacitor is electrically connected to the source electrode of the first transistor and the discharging circuit. A second end of the capacitor is electrically connected to the driving circuit.

The driving circuit includes a second transistor and a third transistor. A drain electrode of the second transistor is electrically connected to a clock terminal. A gate electrode of the second transistor is electrically connected to a first node and the first end of the capacitor. A source electrode of the second transistor is electrically connected to the second end of the capacitor and an output terminal. A drain electrode of the third transistor is electrically connected to the source electrode of the second transistor and the second end of the capacitor. A first voltage is applied to a source electrode of the third transistor. The first or the second clock signal that has the opposite phase to the first clock signal is applied to the clock terminal.

The discharging circuit includes a fourth transistor. A drain electrode of the fourth transistor is electrically connected to the first end of the capacitor. A gate electrode of the fourth transistor is electrically connected to the gate electrode of the third transistor. The second input signal is applied to the gate electrode of the fourth transistor. The first voltage is applied to a source electrode of the fourth transistor.

When the first input signal has a high level, an electric charge is stored in the capacitor. When the second input signal has the high level, the charge in the capacitor is discharged so that an S-R latch operation is performed.

When the electric charge is stored in the capacitor, the first or the second clock signal that is applied to the clock terminal is outputted to the second transistor that is turned on, thereby turning on a plurality of switching elements that are electrically connected to a gate line of the LCD panel. Each of the switching elements includes an amorphous silicon thin film transistor (a-Si TFT). In addition, the second transistor is turned on in response to the second input signal so that the second transistor is pulled down within a first voltage level, so that an AND-gate operation is performed.

Therefore, it is desirable that the first or the second clock signal has the high level that is higher than about 15 volt to turn the amorphous silicon TFT on. The first voltage has a level lower than about −7 volt. It is also desirable that the first voltage is lower than about −7 volt to turn the amorphous silicon TFT off. The amorphous silicon TFT of the switching element is electrically connected to the gate line.

A drain current of the amorphous silicon TFT is proportional to a channel width of the amorphous silicon TFT where the output signal is applied.

For example, when a capacitance of the gate line that is electrically connected to the output terminal is about 250 pF, a channel width and a channel length of the second transistor are about 7000 μm and about 4.5 μm, respectively. A parasite capacitance (Cgd) formed between the gate and drain electrodes of the second transistor increases, when the channel width and the channel length of the second transistor increases.

A time period when the first and second input signals have the low levels is longer than a time period when the first input signal or the second input signal has the high level. Therefore, when the third and fourth transistors have high impedances, the parasite capacitance may be formed between the gate electrode of the second transistor and a drain electrode of the second transistor where the first or the second clock signal is alternately applied, so that a voltage that is synchronized with the first or the second clock signal is induced.

Therefore, when the scan driving circuit includes the amorphous silicon TFT, the parasite capacitance may be formed between the gate and drain electrodes of the second transistor, and the first node floats, thereby deteriorating the scan driving circuit.

BRIEF SUMMARY OF THE INVENTION

The present invention provides a shift register capable of decreasing a parasite capacitance formed between a gate electrode and a drain electrode of a pull-up transistor to prevent a floating of the pull-up transistor outputting a scan signal.

The present invention also provides a scan driving circuit having the shift register.

The present invention also provides a display apparatus having the shift register.

In one exemplary embodiment of the present invention, there is provided a shift register having a plurality of stages to generate a plurality of output signals, in sequence. Each of the stages includes a driving circuit, a charging circuit, a discharging circuit and a holding circuit. The driving circuit is configured to generate a first output signal in response to a first clock signal or a second clock signal having a phase different from the first clock signal. The charging circuit is configured to charge an electric charge in response to a scan start signal or a second output signal of an adjacent previous stage. The discharging circuit is configured to discharge the electric charge in response to a third output signal of an adjacent next stage. The holding circuit is configured to maintain the first output signal within a first voltage when the first output signal is in an inactive state.

In another exemplary embodiment of the present invention, there is also provided a shift register having a plurality of stages to generate a plurality of output signals, in sequence. Each of the stages includes a driving circuit, a charging circuit, a discharging circuit, a hold controlling circuit and a holding circuit. The driving circuit is configured to generate a first output signal in response to a first clock signal or a second clock signal having a phase different from the first clock signal. The charging circuit is configured to charge an electric charge in response to a scan start signal or a second output signal of an adjacent previous stage. The discharging circuit is configured to discharge the electric charge in response to a third output signal of an adjacent next stage. The hold controlling circuit is configured to generate a hold control signal in response to the clock signal applied to the driving circuit. The holding circuit is configured to maintain the first output signal within a first voltage in response to the hold control signal.

In still another exemplary embodiment of the present invention, there is also provided a shift register having a plurality of stages to generate a plurality of output signals, in sequence. Each of the stages includes a driving circuit, a charging circuit, a discharging circuit and a holding circuit. The driving circuit is configured to generate a first output signal in response to one of a plurality of clock signals. The charging circuit is configured to charge an electric charge in response to a scan start signal or a second output signal of an adjacent previous stage. The discharging circuit is configured to discharge the electric charge in response to a third output signal of an adjacent next stage. The holding circuit is configured to maintain the first output signal within a first voltage when the first output signal is in an inactive state.

In still another exemplary embodiment of the present invention, there is also provided a shift register having a plurality of stages to generate a plurality of output signals, in sequence. Each of the stages includes a charging circuit, a driving circuit, a discharging circuit, a hold controlling circuit and a controlling circuit. The charging circuit is configured to charge an electric charge in response to a scan start signal or a second output signal of an adjacent previous stage. The driving circuit is configured to pull up a first output signal of a present stage in response to the electric charge and one of a first clock signal and a second clock signal having a phase different from the first clock signal. The driving circuit is also configured to pull down the first output signal in response to a third output signal of an adjacent next stage. The discharging circuit is configured to discharge the electric charge in response to the third output signal. The hold controlling circuit is configured to output a hold control signal in response to the clock signal applied to the driving circuit. The holding circuit is configured to maintain the first output signal within a first voltage in response to the hold control signal to prevent a floating of the driving circuit.

In one exemplary embodiment of the present invention, there is provided a scan driving circuit including a plurality of stages to generate a plurality of output signals in sequence. Each of the stages includes a charging circuit, a driving circuit, a discharging circuit and a holding circuit. The charging circuit is configured to charge an electric charge in response to a scan start signal or a second output signal of an adjacent previous stage. The driving circuit is configured to pull up a first output signal of a present stage in response to the electric charge and one of a first clock signal and a second clock signal having a phase different from the first clock signal. The driving circuit is also configured to pull down the first output signal in response to a third output signal of an adjacent next stage. The discharging circuit is configured to discharge the electric charge in response to the third output signal. The holding circuit is configured to maintain the first output signal within a first voltage in response to the clock signal applied to the driving circuit to prevent a floating of the driving circuit.

In one exemplary embodiment of the present invention, there is provided a display apparatus including a display cell array circuit that is disposed on a substrate to have a plurality of data lines and a plurality scan lines and a shift register that includes a plurality of stages to generate a plurality of output signals in sequence. Each of the stages includes a driving circuit, a charging circuit, a discharging circuit and a holding circuit. The driving circuit is configured to generate a first output signal of a present stage in response to a first clock signal or a second clock signal having a phase different from the first clock signal. The charging circuit is configured to charge an electric charge in response to the scan start signal or the second output signal. The discharging circuit is configured to discharge the electric charge charged in the charging circuit in response to a third output signal of an adjacent next stage. The holding circuit configured to maintain the first output signal of the present stage within a first voltage.

In another exemplary embodiment of the present invention, there is also provided a display apparatus. The display apparatus includes a display cell array circuit, a first scan driving circuit and a second scan driving circuit. The display cell array circuit is disposed on a substrate to include a plurality of data lines and a plurality of scan lines. The first scan driving circuit includes a shift register that has a plurality of stages to generate a plurality of output signals of the stages to the scan lines in sequence, a first stage receiving a scan start signal, each of the output terminals being electrically connected to each of first ends of the scan lines. The second scan driving circuit is electrically connected to second ends of the scan lines to discharge electric charges formed by the output signals that are applied to the scan lines.

Each of the output signals may be each of scan signals. The control electrode may be a gate electrode, and the first or the second electrode may be a source/drain electrode.

Therefore, a parasite capacitance between a gate electrode of a pull-up transistor that outputs the scan signal and a drain electrode of the pull-up transistor is decreased so that a floating of the gate electrode of the pull-up transistor is prevented. In addition, a floating of a source electrode of the pull-up transistor or the output terminal is also prevented.

BRIEF DESCRIPTION OF THE DRAWINGS

The above and other advantages of the present invention will become more apparent by describing in detail exemplary embodiments thereof with reference to the accompanying drawings, in which.

DESCRIPTION OF EXEMPLARY EMBODIMENTS

It should be understood that the exemplary embodiments of the present invention described below may be varied modified in many different ways without departing from the inventive principles disclosed herein, and the scope of the present invention is therefore not limited to these particular following embodiments. Rather, these embodiments are provided so that this disclosure will be via and complete, and will fully convey the concept of the invention to those skilled in the art by way of example and not of limitation.

Hereinafter, the present invention will be described in detail with reference to the accompanying drawings.

Figure 1:
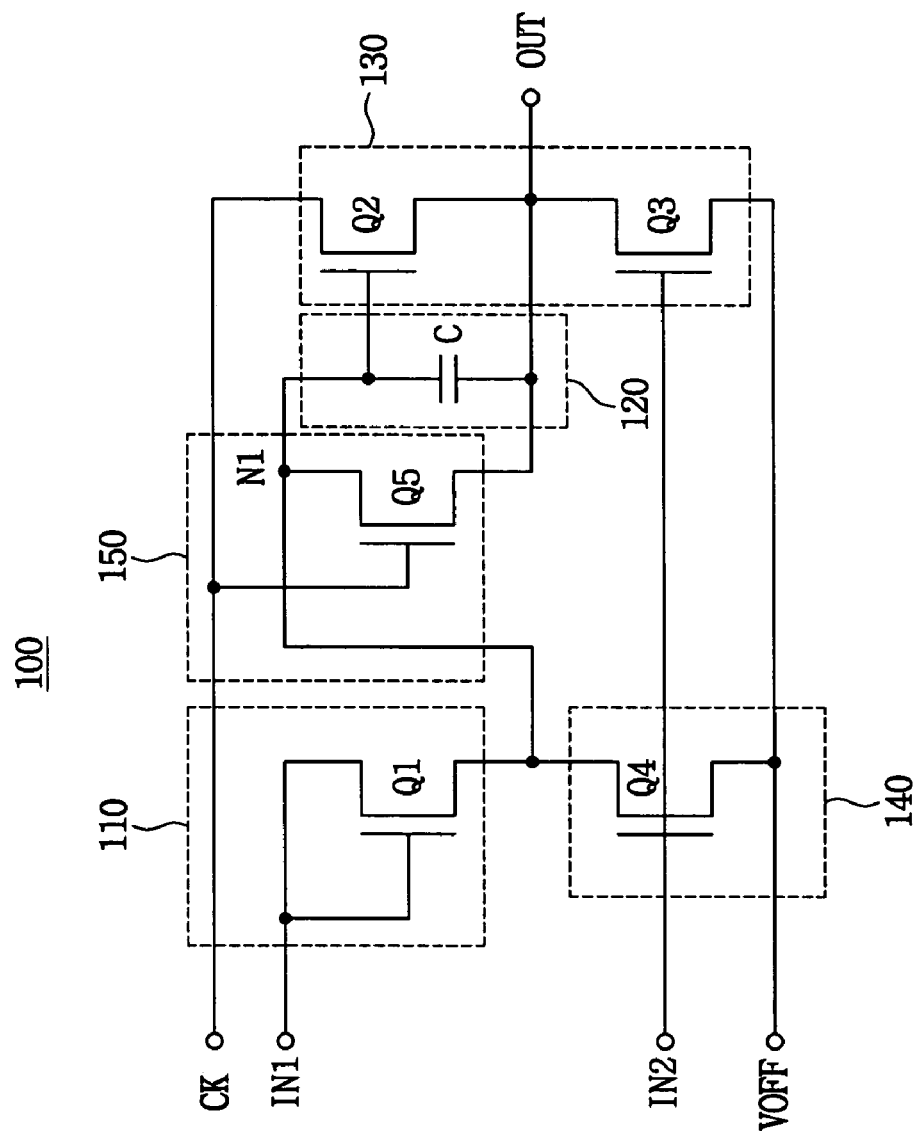
FIG. 1 is a circuit diagram showing a unit stage of a shift register in accordance with an exemplary embodiment of the present invention.

FIG. 1 is a circuit diagram showing a unit stage of a shift register in accordance with an exemplary embodiment of the present invention. A scan driving circuit having the unit stage includes transistors having amorphous silicon thin film transistors (a-Si TFTs). The unit stage prevents a floating of a gate electrode of a second transistor (Q2).

Referring to FIG. 1, the unit stage 100 of the shift register includes a buffer 110, a charging circuit 120, a driving circuit 130, a discharging circuit 140 and a holding circuit 150. The unit stage 100 outputs a gate signal, i.e. a scan signal, in response to a scan start signal (STV) or an output signal of an adjacent previous stage.

The buffer 110 includes a first transistor (Q1). A drain electrode of the first transistor (Q1) is electrically connected to a gate electrode of the first transistor (Q1). A source electrode of the first transistor (Q1) is electrically connected to the charging circuit 120. The drain electrode of the first transistor (Q1) may be a first electrode of the first transistor (Q1). The gate electrode of the first transistor (Q1) may be a control electrode of the first transistor (Q1). The source electrode of the first transistor (Q1) may be a second electrode of the first transistor (Q1). The buffer 110 receives a first input signal (IN1) from an output terminal (OUT) of the adjacent previous stage to supply the charging circuit 120, the driving circuit 130, the discharging circuit 150 and the holding circuit 160 with a gate-on voltage (VON) in response to the first input signal (IN1). The charging circuit 120, the driving circuit 130, the discharging circuit 150 and the holding circuit 160 are electrically connected to the source electrode of the first transistor (Q1). When the unit stage is a first stage, the first input signal (IN1) is the scan start signal (STV).

The charging circuit 120 includes a capacitor (C). A first end of the capacitor (C) is electrically connected to the source electrode of the first transistor (Q1) and the discharging circuit 140. A second end of the capacitor (C) is electrically connected to the output terminal (OUT).

The driving circuit 130 includes a second transistor (Q2) and a third transistor (Q3). A drain electrode of the second transistor (Q2) is electrically connected to a clock terminal (CK). A gate electrode of the second transistor (Q2) is electrically connected to a first node (N1) and the first end of the capacitor (C). A source electrode of the second transistor (Q2) is electrically connected to the second end of the capacitor (C) and the output terminal (OUT). A drain electrode of the third transistor (Q3) is electrically connected to the source electrode of the second transistor (Q2) and the second end of the capacitor (C). A first voltage (VOFF) is applied to a source electrode of the third transistor (Q3). A first clock signal (CKV) is applied to the drain electrode of the second transistor (Q2) via the clock terminal (CK) of each of odd numbered stages. A second clock signal (CKVB) is applied to the drain electrode of the second transistor (Q2) via the clock terminal (CK) of each of even numbered stages. The second transistor (Q2) performs a pull-up operation. The third transistor (Q3) performs a pull-down operation.

The discharging circuit 140 includes a fourth transistor (Q4). A drain electrode of the fourth transistor (Q4) is electrically connected to the first end of the capacitor (C). A gate electrode of the fourth transistor (Q4) is electrically connected to the gate electrode of the third transistor (Q3). A second input signal (IN2) is applied to the gate electrode of the fourth transistor (Q4). The first voltage (VOFF) is applied to a source electrode of the fourth transistor (Q4). The discharging circuit 140 discharges an electric charge that is stored in the capacitor (C) in response to the second input signal (IN2) to a VOFF terminal to which the first voltage (VOFF) is applied via the source electrode of the fourth transistor (Q4).

The holding circuit 150 includes a fifth transistor (Q5). A drain electrode of the fifth transistor (Q5) is electrically connected to the first node (N1) and the first end of the capacitor (C). A gate electrode of the fifth transistor (Q5) is electrically connected to the clock terminal (CK) where the first clock signal (CKV) or the second clock signal (CKVB) is applied. A source electrode of the fifth transistor (Q5) is electrically connected to the second end of the capacitor (C). The holding circuit 150 prevents the floating of the first node (N1). That is, the holding circuit 150 prevents the floating of the capacitor (C) or the gate electrode of the second transistor (Q2).

The source electrode of the fifth transistor (Q5) is electrically connected to the output terminal (OUT). The fifth transistor (Q5) is turned on or turned off in response to the first clock signal or the second clock signal (CKV or CKVB) that is applied to the clock terminal (CK). The first input signal (IN1) is applied to the drain electrode of the fifth transistor (Q5).

The second clock signal (CKVB) has the opposite phase to the first clock signal (CKV). When the first input signal (IN1) or the signal applied to the output terminal (OUT) does not have the high level and the first clock signal (CKV) has the high level, the first node (N1) is maintained within the first voltage (VOFF) level by the fifth transistor (Q5), thereby preventing the floating of the gate electrode of the second transistor (Q2). Namely, the first node (N1) is maintained within a predetermined voltage level by the fifth transistor (Q5).

Figure 2:
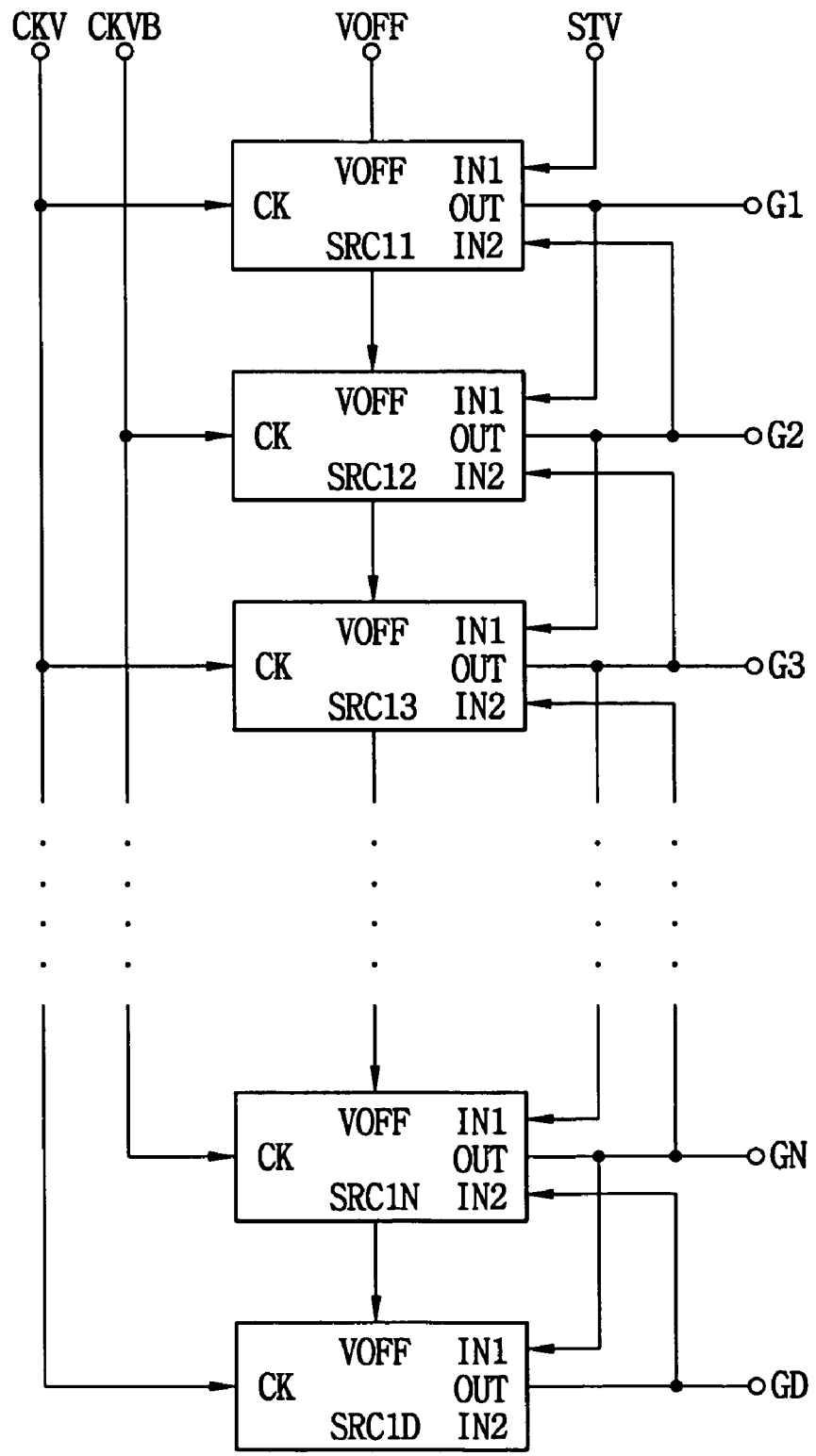
FIG. 2 is a block diagram showing a scan driving circuit having the unit stage shown in FIG. 1.

FIG. 2 is a block diagram showing a scan driving circuit of an LCD apparatus having the unit stage shown in FIG. 1.

Referring to FIG. 2, the scan driving circuit of the LCD apparatus includes a shift register. The shift register includes a plurality of stages (SRC11, SRC12, . . . , SRC1N and SRC1D). The output terminal of each of the stages, which corresponds to a present stage, is electrically connected to a first input terminal of an adjacent next stage. The shift register includes stages (SRC11, SRC12, . . . , SRC1N) corresponding to gate lines and a dummy stage (SRC1D). The number of the stages (SRC11, SRC12, . . . , SRC1N) corresponding to the gate lines is 'n'. Each of the stages (SRC11, SRC12, . . . , SRC1N, SRC1D) includes the first input terminal (IN1), the second input terminal (IN2), the output terminal (OUT), the clock terminal (CK) and a first voltage terminal (VOFF).

The scan start signal (STV) is applied to a first input terminal (IN1) of a first stage (SRC11). A host device, for example a graphic controller, outputs a start signal so that the start signal may be synchronized with a vertical synchronization signal (Vsync), so that the scan start signal (STV) is generated.

The output signals of the stages (SRC11, SRC12, . . . , and SRC1N) corresponding to the gate lines are applied to an LCD panel of the LCD apparatus. For example, the output signal of each of the stages (SRC11, SRC12, . . . , and SRC1N) corresponding to the gate lines is applied to each of the gate lines of an array substrate. A plurality of thin film transistors (TFTs) is formed on the array substrate. The first clock signal (CKV) is applied to the clock terminal (CK) of the odd numbered stages (SRC11, SRC13, . . . , and SRC1N-1). The second clock signal (CKVB) is applied to the clock terminal (CK) of the even numbered stages (SRC12, SRC14, . . . , and SRC1N). The second clock signal (CKVB) has the opposite phase to the first clock signal (CKV). A duty cycle of each of the first and second clock signals (CKV and CKVB) is about 16.6/N [ms].

Output signals of adjacent next stages (SRC12, SRC13, SRC14, . . . , and SRC1D) are applied to second input terminals (IN2) of present stages (SRC11, SRC12, SRC13, . . . , and SRC1N) as control signals, respectively. That is, each of the control signals that are applied to the second input terminals (IN2) is delayed by the duty cycle of each of the output signals of the present stages.

Therefore, the stages (SRC11, SRC12, . . . , and SRC1N) corresponding to the gate lines generate output signals having the high levels, respectively, in sequence.

The dummy stage (SRC1D) outputs a dummy signal (GD) to the second input terminal (IN2) of a last stage (SRC1N). The dummy signal (GD) is a control signal that is applied to the second input terminal (IN2) of the last stage (SRC1N).

The second clock signal (CKVB) may have a phase different from that of the first clock signal (CKV).

For example, the second clock signal (CKVB) has the opposite phase to the first clock signal (CKV), i.e. the second clock signal (CKVB) has 180° phase difference with respect to the first clock signal (CKV). Two stages where the first and second clock signals (CKV and CKVB) are applied may be one unit. Alternately, a plurality of the stages where a plurality of clock signals is applied may be one unit. Alternately, a plurality of the clock signals may also be applied to one stage.

Figure 3:
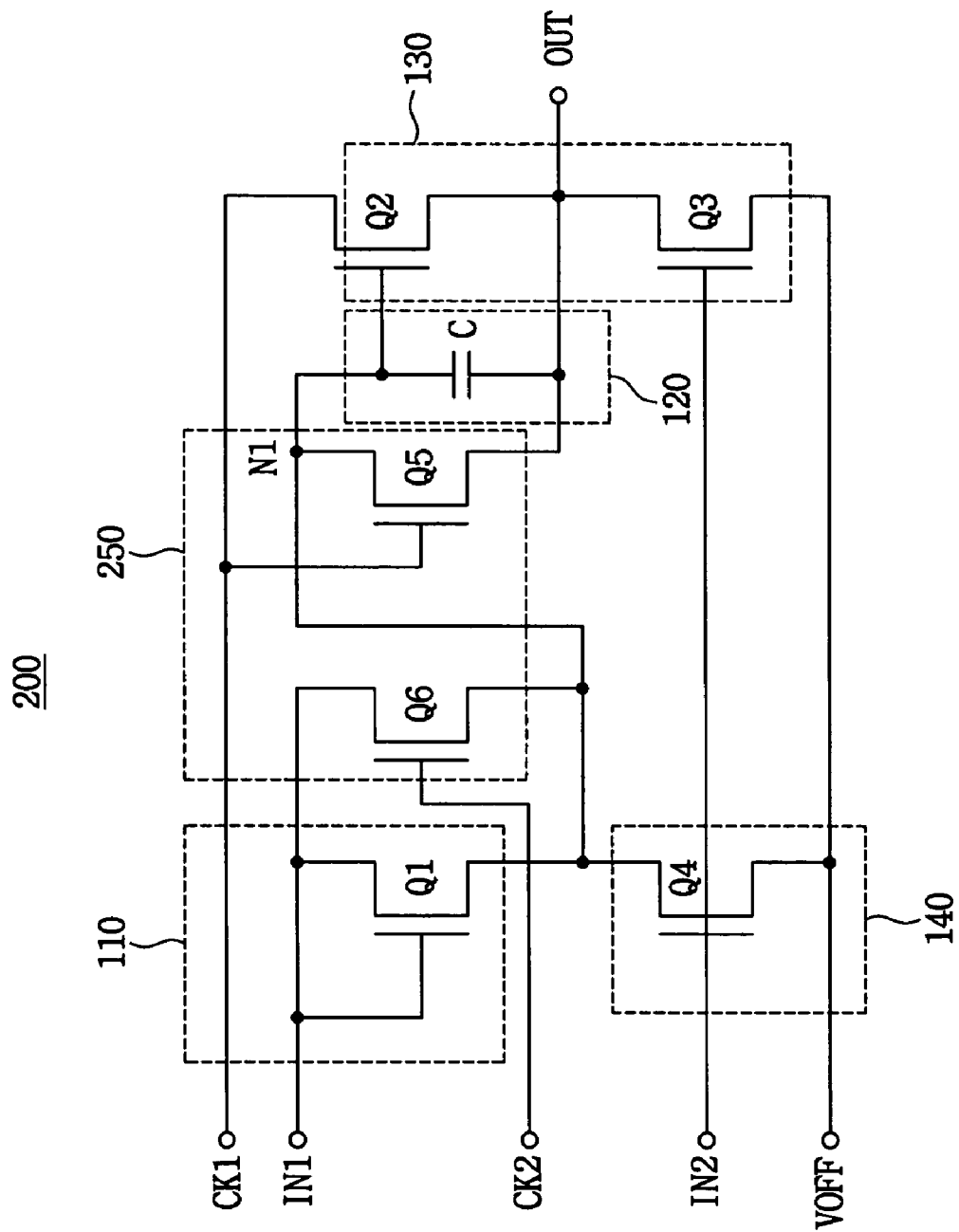
FIG. 3 is a circuit diagram showing a unit stage of a shift register in accordance with another exemplary embodiment of the present invention.

FIG. 3 is a circuit diagram showing a unit stage of a shift register in accordance with another exemplary embodiment of the present invention. The unit stage includes amorphous silicon thin film transistors (a-Si TFTs). The unit stage prevents a floating of a gate electrode of a second transistor (Q2). Referring to FIG. 3 in which the same reference numerals denote the same elements in FIG. 1, and thus any further detailed descriptions concerning the same elements will be omitted.

Referring to FIG. 3, the unit stage 200 of the shift register includes a buffer 110, a charging circuit 120, a driving circuit 130, a discharging circuit 140 and a holding circuit 250. The unit stage 200 outputs a scan signal in response to a scan start signal (STV) or an output signal of an adjacent previous stage.

The holding circuit 250 includes a fifth transistor (Q5) and a sixth transistor (Q6) to prevent a floating of a first node (N1). A first end of a capacitor (C) and a gate electrode of a second transistor (Q2) are electrically connected to the first node (N1).

A drain electrode of the fifth transistor (Q5) is electrically connected to the first node (N1) and the first end of the capacitor (C). A gate electrode of the fifth transistor (Q5) is electrically connected to a first clock terminal (CK1). A source electrode of the fifth transistor (Q5) is electrically connected to a second end of the capacitor (C). The first input signal (IN1) is applied to a drain electrode of the sixth transistor (Q6). A gate electrode of the sixth transistor (Q6) is electrically connected to a second clock terminal (CK2). A source electrode of the sixth transistor (Q6) is electrically connected to the drain electrode of the fifth transistor. When a first clock signal (CKV) is applied to the first clock terminal (CK1), a second clock signal (CKVB) is applied to the second clock terminal (CK2). When the second clock signal (CKVB) is applied to the first clock terminal (CK1), the first clock signal (CKV) is applied to the second clock terminal (CK2).

When the first clock signal (CKV) having a high level is applied to a control electrode of the fifth transistor (Q5), which is the gate electrode of the fifth transistor (Q5), a conductive path is formed between the source and drain electrodes of the fifth transistor (Q5). When the second clock signal (CKVB) having the high level is applied to a control electrode of the sixth transistor (Q6), which is the gate electrode of the sixth transistor (Q6), a conductive path is formed between the source and drain electrodes of the sixth transistor (Q6). The source electrode of the fifth transistor (Q5) that is turned on or turned off by the first clock signal (CKV) is electrically connected to the output terminal (OUT). The first input signal (IN1) is applied to the drain electrode of the sixth transistor (Q6) that is turned on or turned off by the second clock signal (CKVB).

The second clock signal (CKVB) has the opposite phase to the first clock signal (CKV). When the first input signal (IN1) or the signal applied to the output terminal (OUT) does not have the high level and the first clock signal (CKV) has the high level, the first node (N1) is maintained within the first voltage (VOFF) level by the fifth transistor (Q5). When the first input signal (IN1) or the signal applied to the output terminal (OUT) does not have the high level and the second clock signal (CKVB) has the high level, the first node (N1) is maintained within the first voltage (VOFF) by the sixth transistor (Q6). Therefore, the fifth and sixth transistors (Q5 and Q6) prevent the floating of the gate electrode of the second transistor (Q2).

Figure 4:
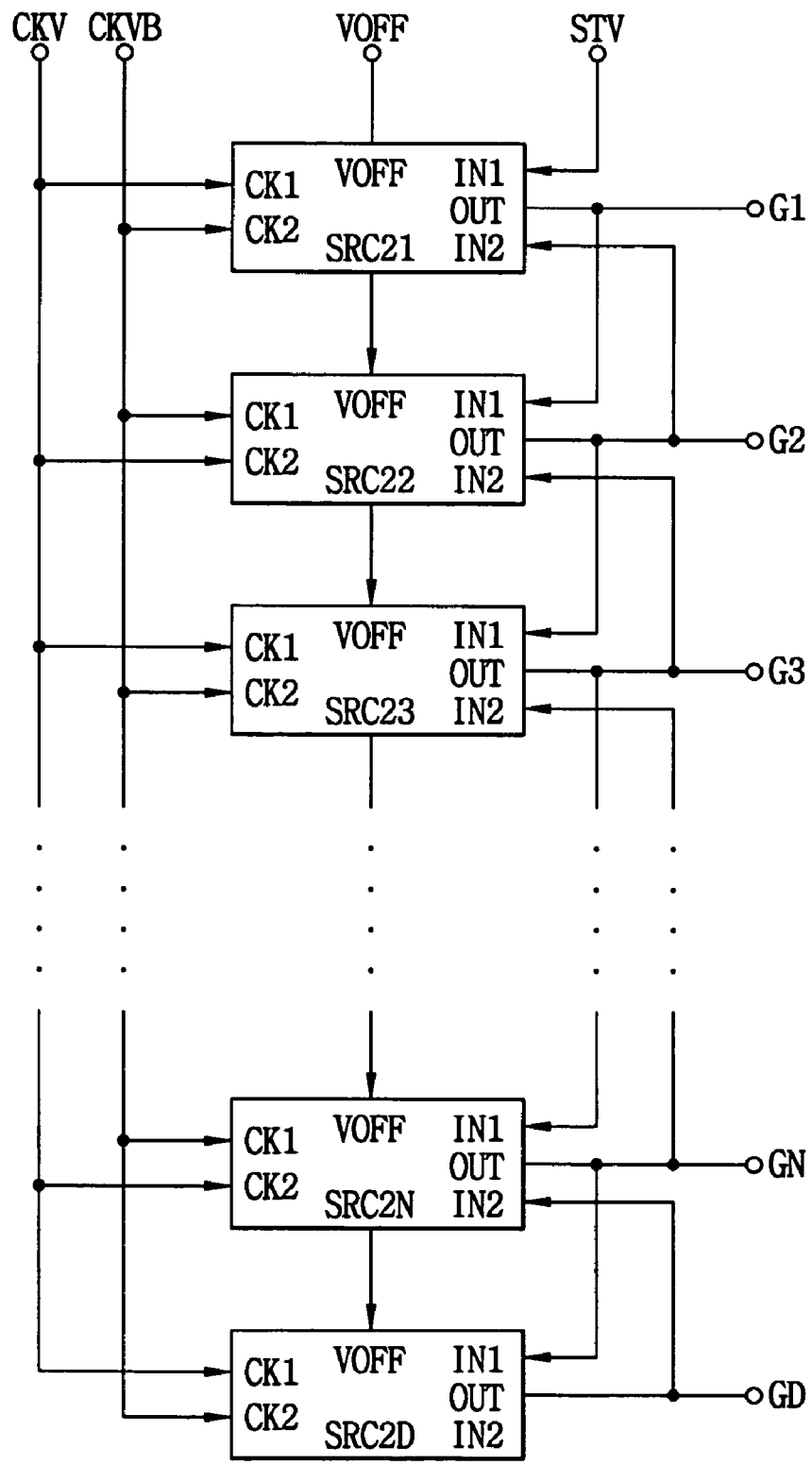
FIG. 4 is a block diagram showing a scan driving circuit having the unit stage shown in FIG. 3.

FIG. 4 is a block diagram showing a scan driving circuit of an LCD apparatus having the unit stage shown in FIG. 3.

Referring to FIG. 4, the scan driving circuit of the LCD apparatus includes a shift register. The shift register includes a plurality of stages (SRC21, SRC22, SRC2N and SRC2D) that are electrically connected to one another. The shift register includes stages (SRC21, SRC22, . . . , SRC2N) corresponding to gate lines and a dummy stage (SRC2D). An output terminal (OUT) of a present stage is electrically connected to a first input terminal (IN1) of an adjacent next stage. The number of the stages (SRC21, SRC22, . . . , SRC2N) corresponding to the gate lines is 'n'. Each of the stages includes the first input terminal (IN1), the second input terminal (IN2), the output terminal (OUT), the first clock terminal (CK1), the second clock terminal (CK2) and the first voltage terminal (VOFF).

The scan start signal (STV) is applied to a first input terminal (IN1) of a first stage (SRC21). A host device, for example a graphic controller, outputs a start signal so that the start signal may be synchronized with a vertical synchronization signal (Vsync), thereby forming the scan start signal (STV).

The output signals of the stages (SRC21, SRC22, . . . , and SRC2N) corresponding to the gate lines are applied to an LCD panel of the LCD apparatus. For example, the output signal of each of the stages (SRC21, SRC22, . . . , and SRC2N) corresponding to the gate lines is applied to each of the gate lines of an array substrate where a plurality of thin film transistors (TFTs) are formed thereon.

The first clock signal (CKV) is applied to the first clock terminal (CK1) of odd numbered stages (SRC21, SRC23, . . . , and SRC2N-1), and the second clock signal (CKVB) is applied to the second clock terminal (CK2) of the odd numbered stages (SRC21, SRC23, . . . , and SRC2N-1). The second clock signal (CKVB) is applied to the first clock terminal (CK1) of even numbered stages (SRC22, SRC24, . . . , and SRC2N), and the first clock signal (CKV) is applied to the second clock terminal (CK2) of the even numbered stages (SRC22, SRC24, . . . , and SRC2N). The second clock signal (CKVB) has the opposite phase to the first clock signal (CKV). A duty cycle of each of the first and second clock signals (CKV and CKVB) is about 16.6/N [ms].

Output signals of adjacent next stages (SRC22, SRC23, SRC24, . . . , and SRC2D) are applied to second input terminals (IN2) of present stages (SRC21, SRC22, SRC23, . . . , and SRC2N) as control signals, respectively. That is, each of the control signals that are applied to the second input terminals (IN2) is delayed by the duty cycle of the output signal of each of the present stages.

Therefore, the stages (SRC21, SRC22, . . . , and SRC2N) corresponding to the gate lines generate active output signals having the high levels in sequence.

The dummy stage (SRC2D) outputs a dummy signal (GD) to a second input terminal (IN2) of a last stage (SRC2N).

According to this exemplary embodiment, the second clock signal (CKVB) has the opposite phase to the first clock signal (CKV), and two stages where the first and second clock signals (CKV and CKVB) are applied form one unit. Alternatively, the second clock signal (CKVB) may have a phase different from the first clock signal (CKV). Phase difference between the first and second clock signals (CKV and CKVB) may be about 90° or about 270°. A plurality of the stages where a plurality of clock signals is applied may form one unit.

Figure 5:
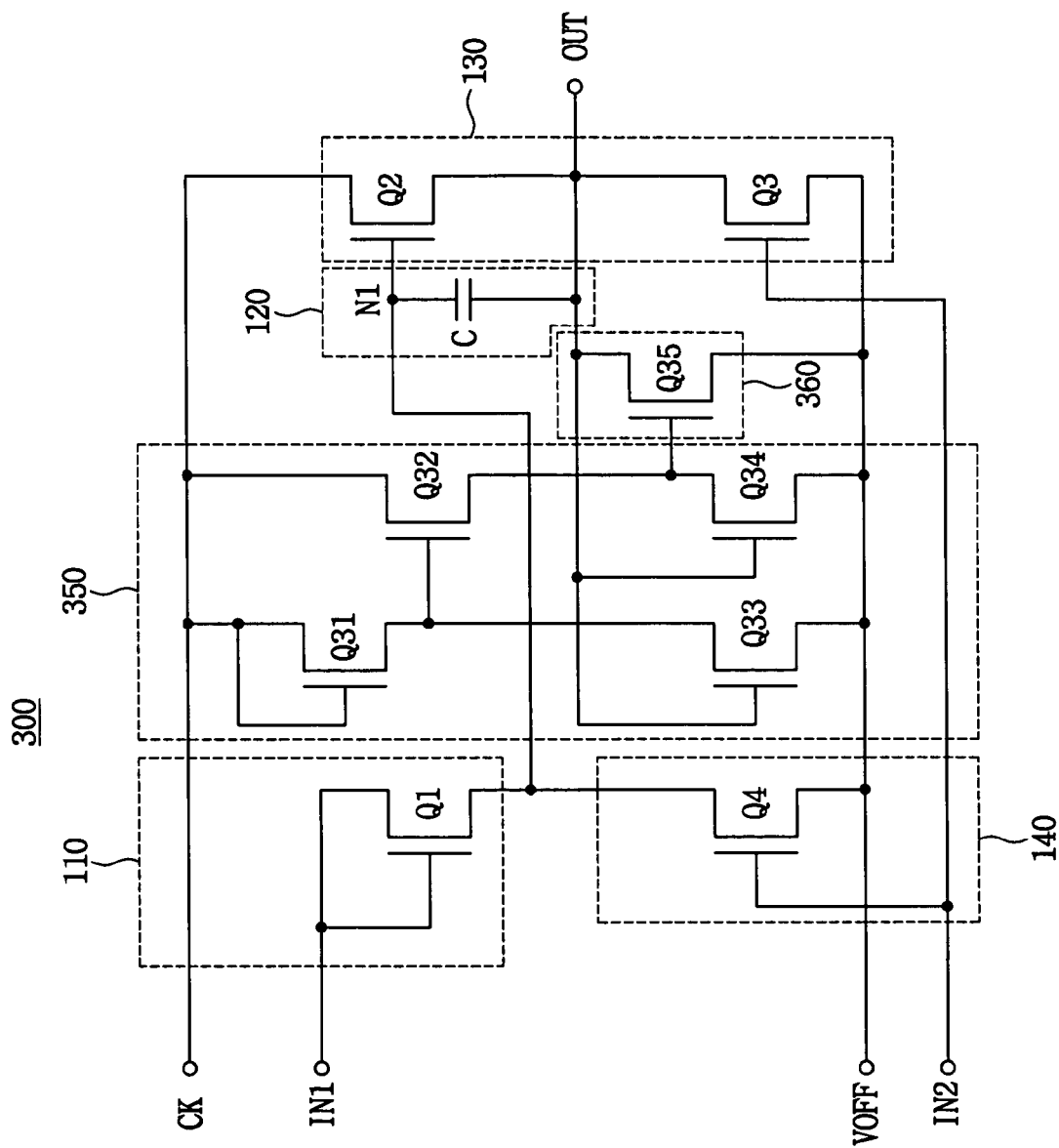
FIG. 5 is a circuit diagram showing a unit stage of a shift register in accordance with another exemplary embodiment of the present invention.

FIG. 5 is a circuit diagram showing a unit stage of a shift register in accordance with another exemplary embodiment of the present invention. The unit stage includes amorphous silicon thin film transistors (a-Si TFTs). The unit stage prevents a floating of a source electrode of a second transistor (Q2). A scan signal is outputted from the source electrode of the second transistor (Q2). Referring to FIG. 5 in which the same reference numerals denote the same elements in FIG. 1, and thus any further detailed descriptions concerning the same elements will be omitted.

Referring to FIG. 5, the unit stage 300 of the shift register includes a buffer 110, a charging circuit 120, a driving circuit 130, a discharging circuit 140, a hold controlling circuit 350 and a holding circuit 360. The unit stage 300 outputs a scan signal in response to a scan start signal (STV) or an output signal of an adjacent previous stage.

The hold controlling circuit 350 includes a first hold transistor (Q31), a second hold transistor (Q32), a third hold transistor (Q33) and a fourth hold transistor (Q34). The hold controlling circuit 350 controls the holding circuit 360.

A drain electrode of the first hold transistor (Q31) and a gate electrode of the first hold transistor (Q31) are electrically connected to a clock terminal (CK). A drain electrode of the second hold transistor (Q32) is electrically connected to the clock terminal (CK). A gate electrode of the second hold transistor (Q32) is electrically connected to the source electrode of the first hold transistor (Q31). A source electrode of the second hold transistor (Q32) is electrically connected to the holding circuit 360. A drain electrode of the third hold transistor (Q33) is electrically connected to the source electrode of the first hold transistor (Q31) and the gate electrode of the second hold transistor (Q32). A gate electrode of the third hold transistor (Q33) is electrically connected to an output terminal (OUT). A first voltage (VOFF) is applied to a source electrode of the third hold transistor (Q33). A drain electrode of the fourth hold transistor (Q34) is electrically connected to the source electrode of the second hold transistor (Q32) and the holding circuit 360. A gate electrode of the fourth hold transistor (Q34) is electrically connected to the output terminal (OUT). The first voltage (VOFF) is applied to a source electrode of the fourth hold transistor (Q34).

The holding circuit 360 includes a fifth hold transistor (Q35) to prevent a floating of the output terminal (OUT) by the control of the hold controlling circuit 350. A drain electrode of the fifth hold transistor (Q35) is electrically connected to the output terminal (OUT). A gate electrode of the fifth hold transistor (Q35) is electrically connected to the hold controlling circuit 350. The first voltage (VOFF) is applied to a source electrode of the fifth hold transistor (Q35). That is, when an output signal outputted from the output terminal (OUT) has a high level, the holding circuit 360 is turned off. A first clock signal (CKV) or a second clock signal (CKVB) having an opposite phase to the first clock signal (CKV) is applied to the clock terminal (CK) that is electrically connected to the fifth hold transistor (Q35).

When the output signal of a present stage, which is outputted from the output terminal (OUT) of the present stage, has the high level, the second hold transistor (Q32) and the fourth hold transistor (Q34) are turned on so that the gate electrode of the fifth hold transistor (Q35) is pulled down at the first voltage (VOFF).

When the output signal of the present stage, which is outputted from the output terminal (OUT) of the present stage, has a low level, a control signal is applied to the gate electrode of the fifth hold transistor (Q35) via the second hold transistor (Q32). The control signal is synchronized with the first clock signal (CKV) or the second clock signal (CKVB) that is applied to the clock terminal (CK). When the output signal that is outputted from the output terminal does not have the high level, a gate voltage that is determined in response to one of the first and second clock signals (CKV and CKVB) having the high level, which is applied to the clock terminal, and a threshold voltage of the first hold transistor (Q31) so that a level of the gate voltage that is applied to the second hold transistor (Q32) equals to a level of the clock signal subtracting a level of the threshold voltage of the first hold transistor (Q31).

That is, when the output signal does not have the high level, the second hold transistor (Q32) outputs the control signal that is synchronized with the first clock signal (CKV) or the second clock signal (CKVB) to the gate electrode of the fifth hold transistor (Q35).

According to this exemplary embodiment, the first clock signal or the second clock signal that alternates between the high level and the low level is applied to the clock terminal (CK). When the output terminal (OUT) does not have the high level and the first clock signal or the second clock signal that is applied to the clock terminal (CK) has the high level, the fifth hold transistor (Q35) applies the first voltage (VOFF) to the output terminal (OUT), thereby preventing the floating of the source electrode of the second transistor (Q2) or the first end of the capacitor (C).

Figure 6:
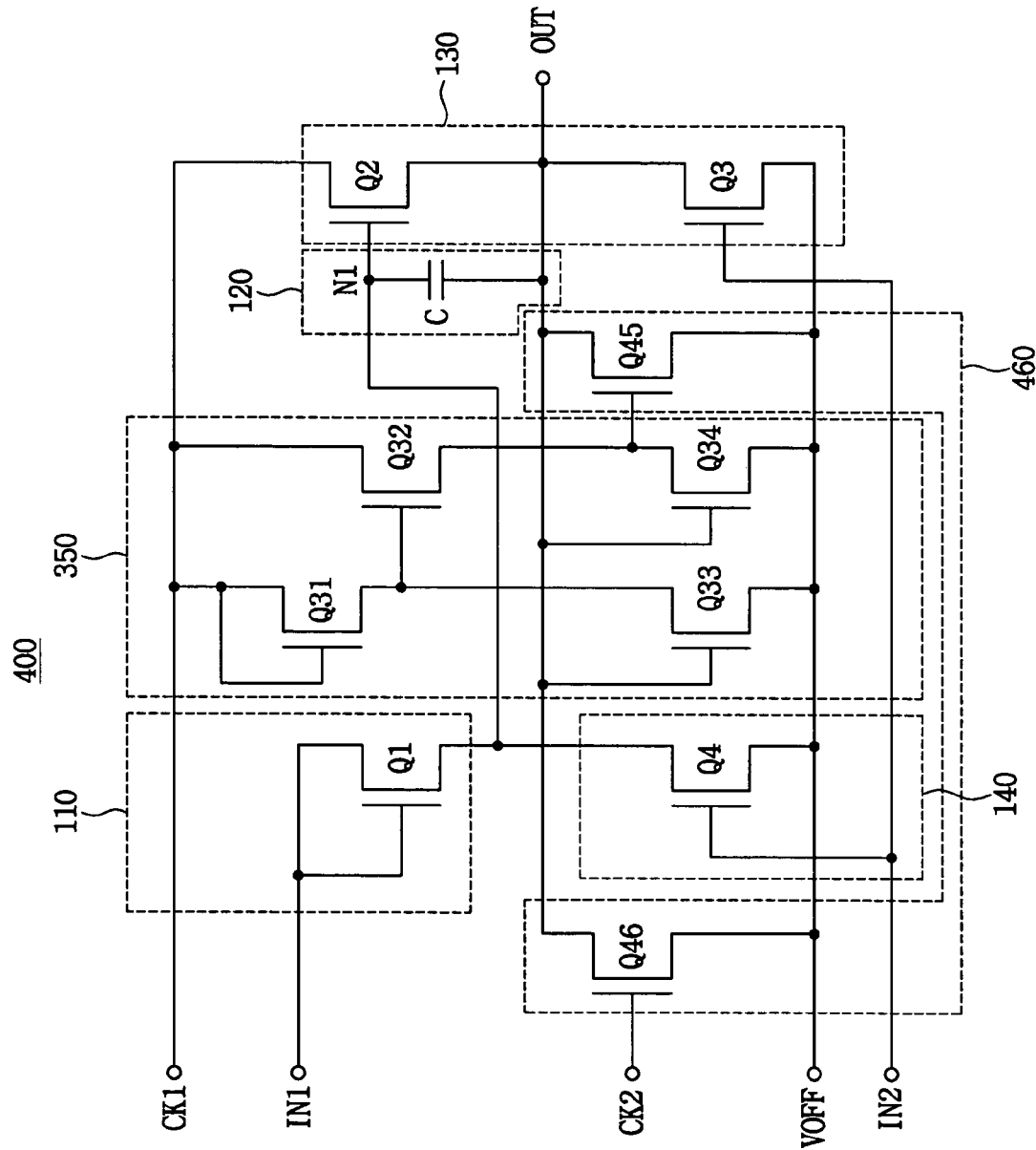
FIG. 6 is a circuit diagram showing a unit stage of a shift register in accordance with another exemplary embodiment of the present invention.

FIG. 6 is a circuit diagram showing a unit stage of a shift register in accordance with another exemplary embodiment of the present invention. The unit stage includes amorphous silicon thin film transistors (a-Si TFTs). The unit stage prevents a floating of an output terminal and a source electrode of a second transistor (Q2). Referring to FIG. 6 in which the same reference numerals denote the same elements in FIGS. 1 and 5, and thus any further detailed descriptions concerning the same elements will be omitted.

Referring to FIG. 6, the unit stage 400 of the shift register includes a buffer 110, a charging circuit 120, a driving circuit 130, a discharging circuit 140, a hold controlling circuit 350 and a holding circuit 460. The unit stage 400 outputs a scan signal in response to a scan start signal (STV) or an output signal of an adjacent previous stage.

The holding circuit 460 includes a fifth hold transistor (Q45) and a sixth hold transistor (Q46) to prevent a floating of an output terminal (OUT). When an output signal of a present stage has a high level, the holding circuit 460 is turned off. A drain electrode of the fifth hold transistor (Q45) is electrically connected to the output terminal (OUT). A gate electrode of the fifth hold transistor (Q45) is electrically connected to the hold controlling circuit 350. A first voltage (VOFF) is applied to a source electrode of the fifth hold transistor (Q45). A drain electrode of the sixth hold transistor (Q46) is electrically connected to the output terminal (OUT). A gate electrode of the sixth hold transistor (Q46) is electrically connected to a second clock terminal (CK2). The first voltage (VOFF) is applied to a source electrode of the sixth hold transistor (Q46). A first clock signal (CKV) is applied to a first clock terminal (CK1), and a second clock signal (CKVB) having an opposite phase to the first clock signal (CKV) is applied to the second clock terminal (CK2). The first clock terminal (CK1) is electrically connected to the fifth hold transistor (Q45). The second clock terminal (CK2) is electrically connected to the sixth hold transistor (Q46).

When the output signal of a present stage, which is outputted from the output terminal (OUT) of the present stage, has the high level, the second hold transistor (Q32) and the fourth hold transistor (Q34) pull down the gate electrode of the fifth hold transistor (Q45) to the first voltage (VOFF).

When the output signal of the present stage, which is outputted from the output terminal (OUT) of the present stage, has a low level, a control signal is applied to the gate electrode of the fifth hold transistor (Q45) via the second hold transistor (Q32). The control signal is synchronized with the first clock signal (CKV). When the output signal that is outputted from the output terminal does not have the high level, a gate voltage that is applied to the gate electrode of the second hold transistor (Q32) is determined in response to the first clock signal (CKV) having the high level and a threshold voltage of the first hold transistor (Q31) so that a level of the gate voltage that is applied to the gate electrode of the second hold transistor (Q32) equals to a level of the first clock signal (CKV) having the high level subtracting a level of the threshold voltage of the first hold transistor (Q31).

When the output signal does not have the high level, the second hold transistor (Q32) outputs the control signal that is synchronized with the first clock signal (CKV) to the gate electrode of the fifth hold transistor (Q45).

When the second clock signal (CKVB) has the high level and the output signal that is outputted from the output terminal (OUT) has the low level, the output terminal (OUT) is maintained within the first voltage (VOFF) by the sixth hold transistor (Q46) in response to the second clock signal (CKVB).

According to this exemplary embodiment, the second clock signal (CKVB) that is applied to the second clock terminal (CK2) has the opposite phase to the first clock signal (CKV) that is applied to the first clock terminal (CK1). When the output signal outputted from the output terminal (OUT) does not have the high level and the first clock signal (CKV) has the high level, the output terminal (OUT) is maintained within the first voltage (VOFF) by the fifth hold transistor (Q45). When the output signal outputted from the output terminal (OUT) does not have the high level and the second clock signal (CKVB) has the high level, the output terminal (OUT) is maintained within the first voltage (VOFF) by the sixth hold transistor (Q46). Therefore, the floating of the output terminal (OUT), the source electrode of the second transistor (Q2) and the first end of the capacitor (C) is prevented.

Figure 7:
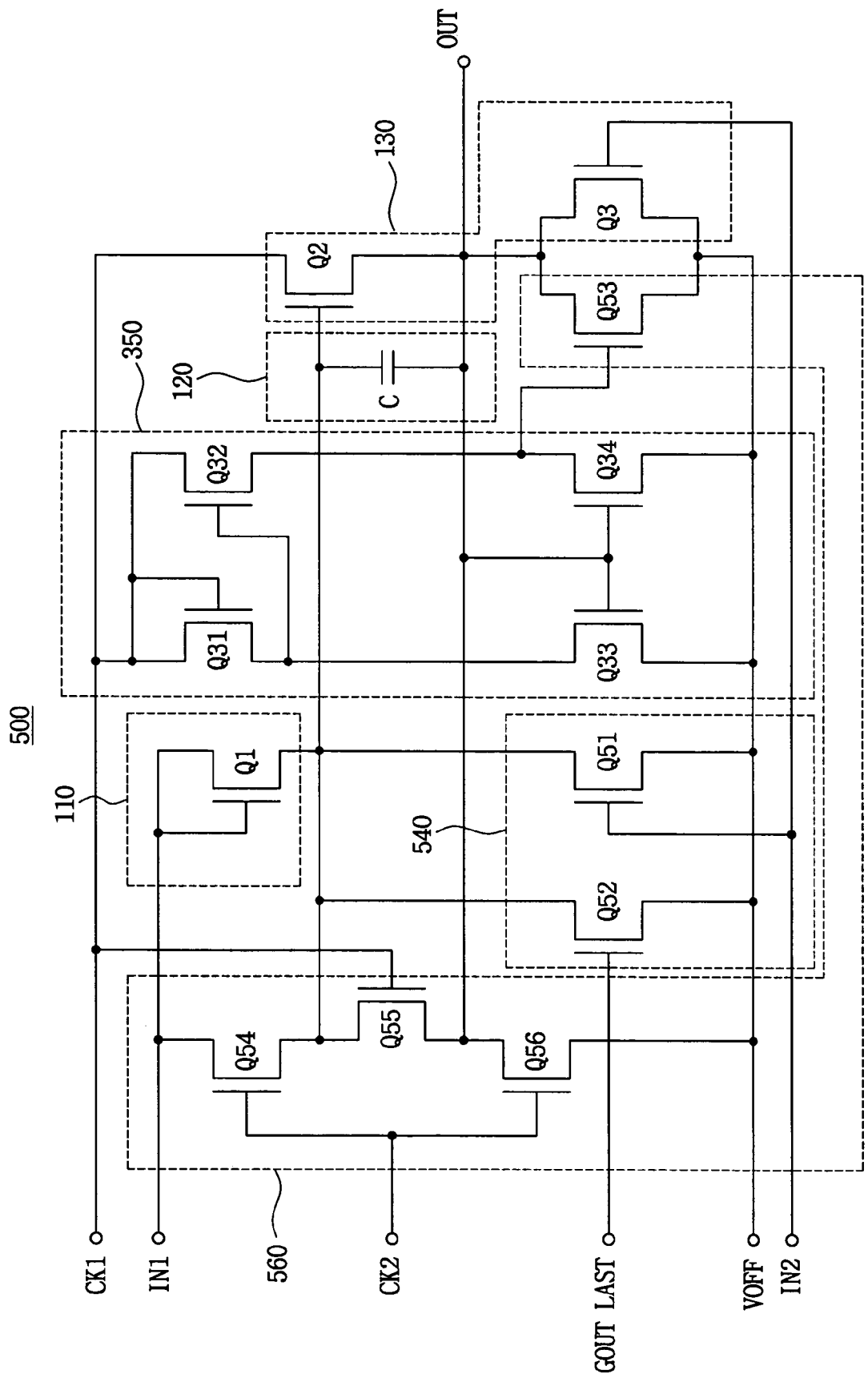
FIG. 7 is a circuit diagram showing a unit stage of a shift register in accordance with another exemplary embodiment of the present invention.

FIG. 7 is a circuit diagram showing a unit stage of a shift register in accordance with another exemplary embodiment of the present invention. The unit stage includes amorphous silicon thin film transistors (a-Si TFTs). The unit stage prevents a floating of an output terminal and a source electrode of a second transistor (Q2). Referring to FIG. 7 in which the same reference numerals denote the same elements in FIGS. 1 and 5, and thus any further detailed descriptions concerning the same elements will be omitted.

Referring to FIG. 7, the unit stage 500 of the shift register includes a buffer 110, a charging circuit 120, a driving circuit 130, a discharging circuit 540, a hold controlling circuit 350 and a holding circuit 560. The unit stage 500 outputs a scan signal in response to a scan start signal (STV) or an output signal of an adjacent previous stage.

The discharging circuit 540 includes a first discharge transistor (Q51) and a second discharge transistor (Q52). The first discharge transistor (Q51) discharges an electric charge stored in a capacitor (C) via a source electrode of the first discharge transistor (Q51) to a first voltage (VOFF) in response to a second input signal (IN2). The second discharge transistor (Q52) also discharges the electric charge stored in the capacitor (C) via a source electrode of the second discharge transistor (Q52) to the first voltage (VOFF) in response to a scan signal (GOUT_LAST) of a last stage.

A drain electrode of the first discharge transistor (Q51) is electrically connected to a first end of the capacitor (C). The second input signal (IN2) is applied to a gate electrode of the first discharge transistor (Q51). The first voltage (VOFF) is applied to the source electrode of the first discharge transistor (Q51). A drain electrode of the second discharge transistor (Q52) is electrically connected to the first end of the capacitor (C). The scan signal (GOUT_LAST) of the last stage is applied to a gate electrode of the second discharge transistor (Q52). The first voltage (VOFF) is applied to the source electrode of the second discharge transistor (Q52).

The holding circuit 560 includes a fifth hold transistor (Q53), a sixth hold transistor (Q54), a seventh hold transistor (Q55) and an eighth hold transistor (Q56) to prevent a floating of an output terminal (OUT). When an output signal of a present stage has a high level, the holding circuit 560 is turned off.

A drain electrode of the fifth hold transistor (Q53) is electrically connected to the output terminal (OUT). A gate electrode of the fifth hold transistor (Q53) is electrically connected to the hold controlling circuit 350. The first voltage (VOFF) is applied to a source electrode of the fifth hold transistor (Q53).

A first input signal (IN1) is applied to a drain electrode of the sixth hold transistor (Q54). A gate electrode of the sixth hold transistor (Q54) is electrically connected to a second clock terminal (CK2). A source electrode of the sixth hold transistor (Q54) is electrically connected to the first end of the capacitor (C).

A drain electrode of the seventh hold transistor (Q55) is electrically connected to the source electrode of the sixth hold transistor (Q54) and the first end of the capacitor (C). A gate electrode of the seventh hold transistor (Q55) is electrically connected to a first clock terminal (CK1). A source electrode of the seventh hold transistor (Q55) is electrically connected to the output terminal (OUT).

A drain electrode of the eighth hold transistor (Q56) is electrically connected to the output terminal (OUT). A gate electrode of the eighth hold transistor (Q56) is electrically connected to the gate electrode of the sixth hold transistor (Q54) and the second clock terminal (CK2). The first voltage (VOFF) is applied to a source electrode of the eighth hold transistor (Q56). A second clock signal (CKVB) applied to the second clock terminal (CK2) has an opposite phase to a first clock signal (CKV) applied to the first clock terminal (CK1).

When the output signal of a present stage, which is outputted from the output terminal (OUT) of the present stage, has the high level, a second hold transistor (Q32) and a fourth hold transistor (Q34) pull down the gate electrode of the fifth hold transistor (Q53) to the first voltage (VOFF).

When the output signal of the present stage, which is outputted from the output terminal (OUT) of the present stage, has a low level, a control signal is applied to the gate electrode of the fifth hold transistor (Q53) via the second hold transistor (Q32). The control signal is synchronized with the first clock signal (CKV). When the output signal that is outputted from the output terminal does not have the high level, a gate voltage that is applied to a gate electrode of the second hold transistor (Q32) is determined in response to the first clock signal (CKV) having the high level and a threshold voltage of the first hold transistor (Q31) so that a level of the gate voltage that is applied to the gate electrode of the second hold transistor (Q32) equals to a level of the first clock signal (CKV) having the high level subtracting a level of the threshold voltage of the first hold transistor (Q31).

When the output signal outputted from the output terminal (OUT) does not have the high level, the second hold transistor (Q32) outputs the control signal that is synchronized with the first clock signal (CKV) to the gate electrode of the fifth hold transistor (Q53).

When the second clock signal (CKVB) has the high level and the output signal that is outputted from the output terminal (OUT) has the low level, the output terminal (OUT) is maintained within the first voltage (VOFF) by the sixth hold transistor (Q46) in response to the second clock signal (CKVB).

Figure 8:
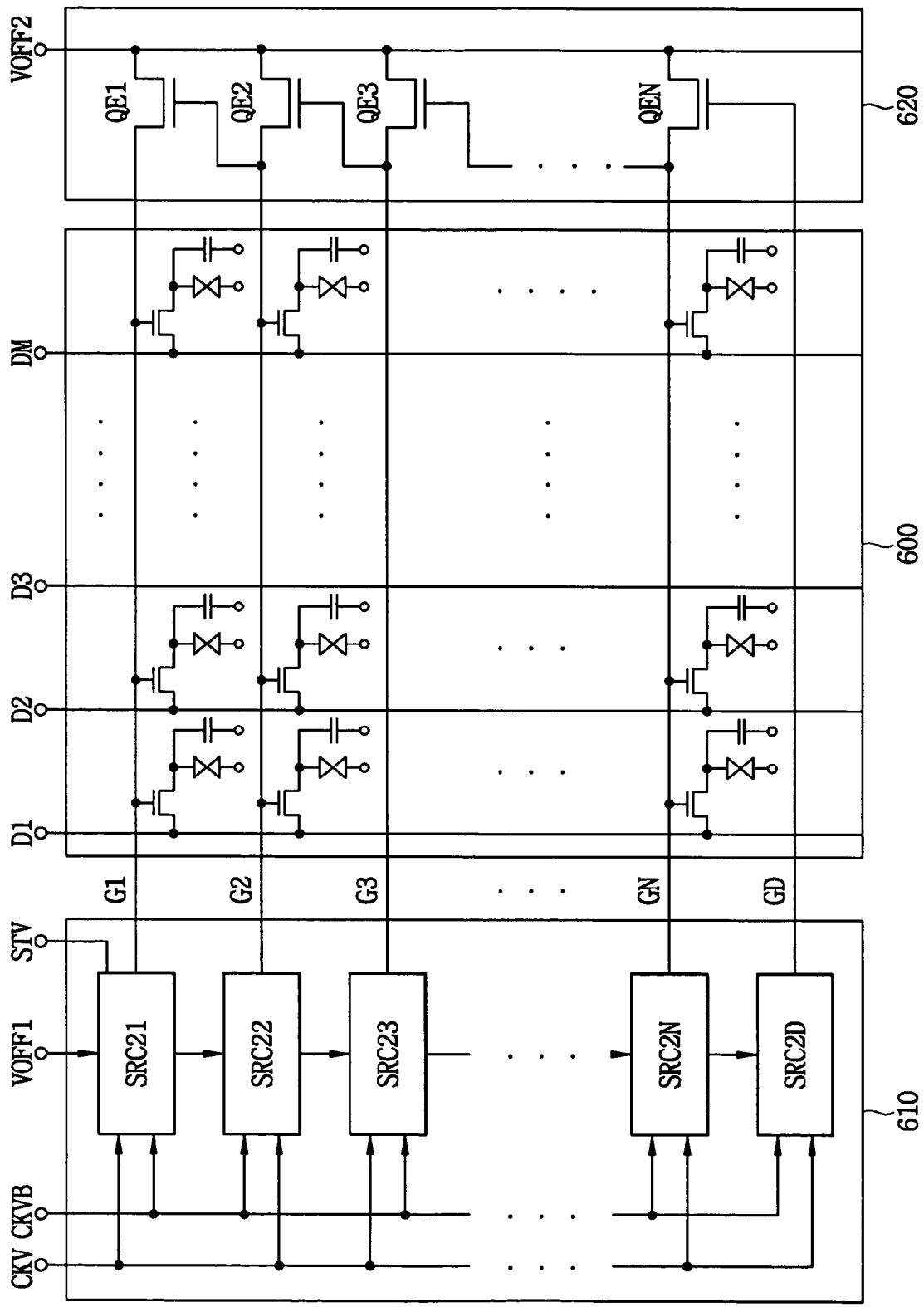
FIG. 8 is a schematic view showing an LCD panel having a scan driving circuit having the unit stage shown in FIG. 7.

FIG. 8 is a schematic view showing an LCD panel having a scan driving circuit having the unit stage shown in FIG. 7.

Referring to FIG. 8, a first scan driving circuit 610 is disposed in a region adjacent to a cell array circuit 600. The cell array circuit 600 is disposed in a region defined by a data line and a scan line. The cell array circuit 600 may be disposed in a region defined by a plurality of the data lines and a plurality of the scan lines. A second scan driving circuit 620 is disposed in a region adjacent to the cell array circuit 600. The second scan driving circuit 620 corresponds to the first scan driving circuit 610, and the cell array circuit 600 is disposed between the first scan driving circuit 610 and the second scan driving circuit 620. The cell array circuit 600, the first scan driving circuit 610 and the second scan driving circuit 620 are formed on a same substrate.

The first scan driving circuit 610 includes a plurality of the stages. The first and second clock signals (CKV and CKVB) are applied to each of the stages. A scan start signal (STV) is applied to a first input terminal of a first stage. Each of the stages is electrically connected to each of the scan lines that are firmed in the cell array circuit 600 to output each of output signals (G1, G2, . . . , GN, GD). The output signals (G1, G2, . . . , GN, GD) are scan signals, respectively.

The second driving circuit 620 includes a plurality of discharge transistors (QE1, QE2, . . . , QEN). Each of the discharge transistors (QE1, QE2, . . . , QEN) is electrically connected to each of second ends of the scan lines. The ends of the scan lines are disposed in the cell array circuit 600. The second driving circuit 620 discharges electric charges formed by the scan signals via the scan lines.

A source electrode of a first discharge transistor (QE1) is electrically connected to a second end of a first scan line. A third voltage (VOFF2) is applied to a drain electrode of the first discharge transistor (QE1). A gate electrode of the first discharge transistor (QE1) is electrically connected to a second end of a second scan line. When a second output signal (G2) is applied to the gate electrode of the first discharge transistor (QE1) via the second scan line, the first discharge transistor (QE1) is turned on so that a first output signal (G1) is applied to a VOFF2 terminal to which the third voltage (VOFF2) is applied. The third voltage (VOFF2) is higher than the first voltage (VOFF1). Alternatively, the third voltage (VOFF2) may be lower than or equal to the first voltage (VOFF1).

The discharge transistors (QE1, QE2, . . . , QEN) are electrically connected to the second ends of the scan lines, respectively, to form discharge paths, thereby preventing an interference that may be formed by delays of the scan signals.

In addition, each of the discharge transistors (QE1, QE2, . . . , QEN) may be disposed on the driving circuit 130 to compensate a capacity of a third transistor (Q3). A capacity of each of the discharge transistors (QE1, QE2, . . . , QEN) is larger than that of the third transistor (Q3). For example, the capacity of each of the discharge transistors (QE1, QE2, . . . , QEN) is about five times larger than that of the third transistor (Q3) to compensate the capacity of the third transistor (Q3).

According to this exemplary embodiment, the floating of the output terminals and internal nodes of the scan driving circuit is prevented using the first and second clock signals (CKV and CKVB) that include alternating currents so that a display quality of the LCD apparatus may be improved.

Figure 9:
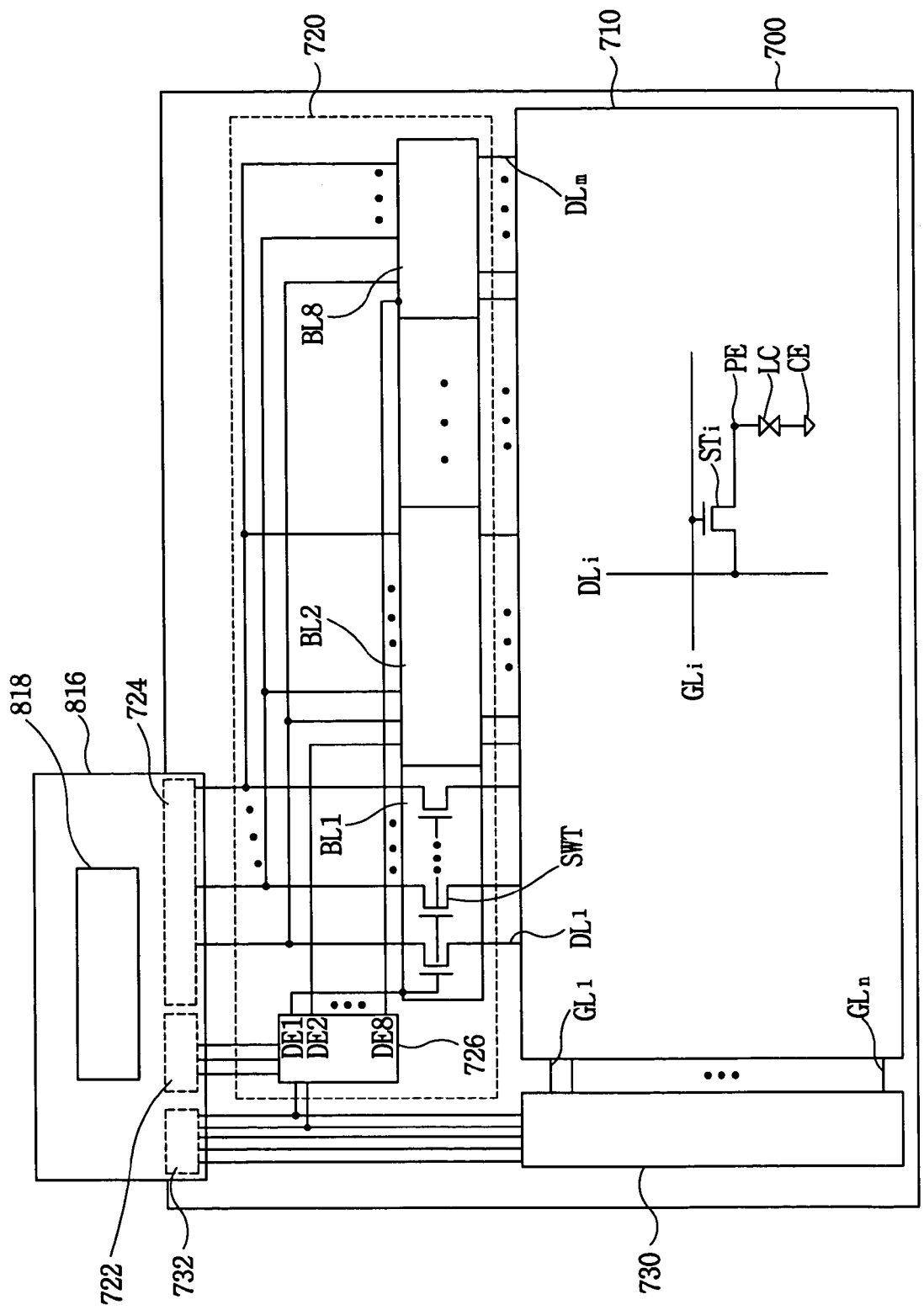
FIG. 9 is a schematic view showing an LCD apparatus in accordance with an exemplary embodiment of the present invention.

FIG. 9 is a schematic view showing an LCD apparatus in accordance with an exemplary embodiment of the present invention. The LCD apparatus includes an array substrate having amorphous silicon thin film transistors (a-Si TFTs). Referring to FIG. 9 in which the same reference numerals denote the same elements in FIGS. 1 to 7, and thus any further detailed descriptions concerning the same elements will be omitted.

Referring to FIG. 9, the array substrate 700 includes a display cell array circuit 710, a data driving circuit 720, a first data terminal circuit 722, a second data terminal circuit 724, a scan driving circuit 730 and a scan terminal circuit 732. The display cell array circuit 710, the data driving circuit 720, the first data terminal circuit 722, the second data terminal circuit 724, the scan driving circuit 730 and the scan terminal circuit 732 may be formed on a same substrate.

An integrated control driving circuit 818 is disposed on a flexible printed circuit board 816. The circuits of the array substrate 700 are electrically connected to the integrated control driving circuit 818 via the flexible printed circuit board 816. The flexible printed circuit board 816 supplies the data driving circuit 720 and the scan driving circuit 730 of the array substrate 700 with a data signal, a data timing signal, a gate timing signal and a gate driving voltage. The flexible printed circuit board 816 may supply the data driving circuit 720 and the scan driving circuit 730 of the array substrate 700 with a plurality of the data signals, a plurality of the data timing signals, a plurality of the gate timing signals and a plurality of the gate driving voltages.

The display cell array circuit 710 includes a plurality of data lines (DL1, DL2, . . . , DLm) and a plurality of gate lines (GL1, GL2, . . . , GLn). Numbers of the data lines (DL1, DL2, . . . , DLm) and the gate lines (GL1, GL2, . . . , GLn) are 'm' and 'n', respectively. The data lines (DL1, DL2, . . . , DLm) are extended in a column direction that is a longitudinal direction. The gate lines (GL1, GL2, . . . , GLn) are extended in a horizontal direction.

A pixel transistor (STi) is disposed adjacent to a position where each of the data lines (DL, DL2, . . . , DLi, . . . , DLm) crosses each of the gate lines (GL1, GL2, . . . , GLi, . . . , GLn). A drain electrode of the pixel transistor (STi) is electrically connected to a data line (DLi) that is disposed adjacent to the pixel transistor (STi). A gate electrode of the pixel transistor (STi) is electrically connected to a gate line (GLi) that is disposed adjacent to the pixel transistor (STi). A source electrode of the pixel transistor (STi) is electrically connected to a pixel electrode (PE). A liquid crystal (LC) is disposed between the pixel electrode (PE) and a common electrode (CE) of a color filter substrate.

Therefore, the liquid crystal (LC) varies arrangement in response to an electric field applied between the pixel electrode (PE) and the common electrode (CE), and a light transmittance of the liquid crystal (LC) may be changed to display an image.

The data driving circuit 720 includes a shift register 726 and a plurality of switching transistors (SWTs). The number of the switching transistors (SWTs) is 'N'. The switching transistors (SWTs) are grouped to form eight data line blocks (BL1, BL2, . . . , BL8). The number of the switching transistors (SWTs) in each of the data line blocks (BL1, BL2, . . . , BL8) is 'N/8'.

Each of the data line blocks (BL1, BL2, . . . , BL8) includes a plurality of input terminals and a plurality of output terminals. Numbers of the input terminals and the output terminals are 'N/8' and 'N/8', respectively. The input terminals of each of the data line blocks (BL1, BL2, . . . , BL8) are electrically connected to the second data terminal circuit 724. The second data terminal circuit 724 includes a plurality of data terminals. The number of the data terminals is 'N/8'. Each of the output terminals of the data line blocks (BL1, BL2, . . . , BL8) is electrically connected to each of the data lines. The shift register 726 includes eight end terminals. One of the end terminals is electrically connected to a block selection terminal of the shift register 726. The shift register 726 may include a plurality of the block selection terminals. The shift register 726 may also include eight block selection terminals.

A source electrode of each of the switching transistors (SWTs) is electrically connected to each of the data lines. A drain electrode of each of the switching transistors (SWTs) is electrically connected to one of the data terminals. Each of gate electrodes of the switching transistors (SWTs) is electrically connected to one of the block selection terminals. The switching transistors (SWTs) may include amorphous silicon TFTs, respectively. Each of the amorphous silicon TFTs may be a metal oxide semiconductor (MOS) transistor.

Therefore, the data lines are grouped to eight data line blocks. Numbers of the total data lines and the data lines in each of the data line blocks are 'N' and 'N/8', respectively. The shift register outputs eight block selection signals. Each of the data line blocks is selected in response to each of the block selection signals.

A first clock signal (CKV), a second clock signal (CKVB) and a block selection start signal (STH) are applied to the shift register 726 via the first data terminal circuit 722. The first data terminal circuit 722 may include three terminals. Each of the end terminals of the shift register 726 is electrically connected to each of the block selection terminals of the data line blocks.

The scan driving circuit 730 may be disposed adjacent to a side of the display cell array circuit 710. Alternatively, the scan driving circuit may include a first scan driving circuit disposed adjacent to a side of the display cell array circuit and a second scan driving circuit disposed adjacent to another side of the display cell array circuit.

The LCD apparatus includes the shift register of the scan driving circuit. An organic electro luminescent display (OELD) apparatus may include the shift register of the scan driving circuit.

According to the present invention, a gate electrode of a pull-up transistor that outputs a scan signal is electrically connected to a hold transistor to decrease a parasite capacitance between the gate electrode of the pull-up transistor and a drain electrode of the pull-up transistor, thereby preventing a floating of the gate electrode of the pull-up transistor or an output terminal where the scan signal is outputted.

In addition, a first clock signal and a second clock signal that has an opposite phase to the first clock signal are applied to a scan driving circuit of an LCD apparatus having an amorphous silicon TFT to prevent floating of nodes and output terminals. Therefore, lifetime of the amorphous silicon TFT is increased and reliability thereof is improved, although a high voltage is applied to the amorphous silicon TFT. Therefore, a display quality of the LCD apparatus is increased.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A shift register having a plurality of stages to generate a plurality of output signals in sequence, each of the stages comprising:

a driving circuit configured to generate a first output signal in response to a first clock signal or a second clock signal having a phase different from the first clock signal;

a charging circuit configured to charge an electric charge in response to a scan start signal or a second output signal of an adjacent previous stage;

a discharging circuit configured to discharge the electric charge in response to a third output signal of an adjacent next stage; and a holding circuit configured to maintain the first output signal within a first voltage when the first output signal is in an inactive state, the holding circuit comprising a first hold transistor that maintains the first output signal within the first voltage in response to the first clock signal.

2. The shift register of claim 1, wherein the holding circuit maintains the first output signal within the first voltage in response to the first or the second clock signal that is applied to the driving circuit.

3. The shift register of claim 2, wherein the holding circuit maintains the first output signal within the first voltage when the first or the second clock signal that is applied to the driving circuit is in an active state.

4. The shift register of claim 1, wherein the driving circuit comprises an output terminal via which the first output signal is outputted, and the holding circuit maintains the first output signal within the first voltage to prevent the output terminal from becoming higher than the first voltage.

5. The shift register of claim 1, wherein the driving circuit comprises a driving transistor including a first electrode that receives the first or the second clock signal that is applied to the driving circuit, and a second electrode via which the first output signal is pulled up, and the holding circuit comprises the first hold transistor including a first electrode that is electrically connected to a control electrode of the driving transistor, a second electrode that is electrically connected to the second electrode of the driving transistor and a control electrode that receives the first or the second clock signal that is applied to the driving circuit.

6. The shift register of claim 1, wherein the holding circuit further comprises a second hold transistor that includes a control electrode receiving the second clock signal, a first electrode receiving the second output signal and a second electrode electrically connected to a first electrode of the first hold transistor.

7. The shift register of claim 6, wherein the driving circuit pulls up the first output signal in response to the electric charge charged in the charging circuit and one of the first and the second clock signal applied to the driving circuit, and the driving circuit pulls down the first output signal in response to the third output signal.

8. The shift register of claim 1, further comprising a buffer that supplies the driving circuit with the scan start signal or the second output signal.

9. The shift register of claim 1, wherein the second clock signal comprises an opposite phase to the first clock signal.

10. A shift register having a plurality of stages to generate a plurality of output signals in sequence, each of the stages comprising:

a driving circuit configured to generate a first output signal in response to a first clock signal or a second clock signal having a phase different from the first clock signal;

a charging circuit configured to charge an electric charge in response to a scan start signal or a second output signal of an adjacent previous stage;

a discharging circuit configured to discharge the electric charge in response to a third output signal of an adjacent next stage;

a hold controlling circuit configured to generate a hold control signal in response to the first or the second clock signal applied to the driving circuit; and a holding circuit configured to maintain the first output signal within a first voltage in response to the hold control signal, the holding circuit comprising a first hold transistor that maintains the first output signal within the first voltage in response to the first clock signal.

11. The shift register of claim 10, wherein the hold controlling circuit generates the hold control signal, when the first or the second clock signal applied to the driving circuit is in an active state.

12. A shift register having a plurality of stages to generate a plurality of output signals in sequence, each of the stages comprising:

a driving circuit configured to generate a first output signal in response to one of a plurality of clock signals;

a charging circuit configured to charge an electric charge in response to a scan start signal or a second output signal of an adjacent previous stage;

a discharging circuit configured to discharge the electric charge in response to a third output signal of an adjacent next stage; and a holding circuit configured to maintain the first output signal within a first voltage when the first output signal is in an inactive state, the holding circuit comprising a first hold transistor that maintains the first output signal within the first voltage in response to the first clock signal.

13. The shift register of claim 12, wherein the holding circuit maintains the first output signal within the first voltage, when one of the plurality of clock signals applied to the driving circuit is in an active state.

14. The shift register of claim 12, wherein the holding circuit maintains the first output signal within the first voltage to prevent a floating of the driving circuit.

15. A shift register having a plurality of stages to generate a plurality of output signals in sequence, each of the stages comprising:

a charging circuit configured to charge an electric charge in response to a scan start signal or a second output signal of an adjacent previous stage;

a driving circuit configured to pull up a first output signal of a present stage in response to the electric charge and one of a first clock signal and a second clock signal having a phase different from the first clock signal, the driving circuit configured to pull down the first output signal in response to a third output signal of an adjacent next stage;

a discharging circuit configured to discharge the electric charge in response to the third output signal;

a hold controlling circuit configured to output a hold control signal in response to the first or the second clock signal applied to the driving circuit, the hold controlling circuit comprising a first hold transistor including a first electrode that receives the first clock signal, a control electrode that is electrically connected to the first electrode of the first hold transistor, and a second electrode; and a holding circuit configured to maintain the first output signal within a first voltage in response to the hold control signal to prevent a floating of the driving circuit.

16. The shift register of claim 15, further comprising a buffer configured to supply the charging circuit with the scan start signal or the second output signal.

17. The shift register of claim 15, wherein the hold controlling circuit generates the hold control signal, when the first or the second clock signal applied to the driving circuit is in an active state.

18. The shift register of claim 15, wherein the hold controlling circuit further comprises:
- a second hold transistor including a first electrode that receives the first clock signal, a control electrode that is electrically connected to the second electrode of the first hold transistor, and a second electrode that is electrically connected to the holding circuit;
- a third hold transistor including a first electrode that is electrically connected to the second electrode of the first hold transistor and the control electrode of the second hold transistor, a control electrode that is electrically connected to an output terminal where the first output signal is outputted, and a second electrode receiving the first voltage; and
- a fourth hold transistor including a first electrode that is electrically connected to the second electrode of the second hold transistor and the holding circuit, a control electrode that is electrically connected to the output terminal, and a second electrode receiving the first voltage.

19. The shift register of claim 15, wherein the driving circuit comprises a driving transistor including a first electrode that receives the first clock signal and a second electrode, via which the first output signal is pulled up, and the holding circuit comprises a fifth hold transistor including a control electrode that receives the first clock signal via the hold controlling circuit, a first electrode that is electrically connected to the second electrode of the driving transistor, and a second electrode that receives the first voltage.

20. The shift register of claim 19, wherein the fifth hold transistor is turned on to maintain the second electrode of the driving transistor within the first voltage, when the first clock signal is in an active state and the first output signal is an inactive state.

21. The shift register of claim 19, wherein the holding circuit further comprises a sixth hold transistor including a control electrode that receives the second clock signal, a first electrode that is electrically connected to the second electrode of the driving transistor, and a second electrode that receives the first voltage.

22. The shift register of claim 21, wherein the fifth hold transistor is turned on to maintain the second electrode of the driving transistor within the first voltage, when the first clock signal is in an active state and the first output signal is an inactive state.

23. The shift register of claim 21, wherein the sixth hold transistor is turned on to maintain the second electrode of the driving transistor within the first voltage, when the second clock signal is in an active state and the first output signal is an inactive state.

24. A scan driving circuit including a plurality of stages to generate a plurality of output signals in sequence, each of the stages comprising:
- a charging circuit configured to charge an electric charge in response to a scan start signal or a second output signal of an adjacent previous stage;
- a driving circuit configured to pull up a first output signal of a present stage in response to the electric charge and one of a first clock signal and a second clock signal having a phase different from the first clock signal, the driving circuit configured to pull down the first output signal in response to a third output signal of an adjacent next stage;
- a discharging circuit configured to discharge the electric charge in response to the third output signal; and
- a holding circuit configured to maintain the first output signal within a first voltage in response to the first or the second clock signal applied to the driving circuit to prevent a floating of the driving circuit, the holding circuit comprising a first hold transistor including a first electrode that is electrically connected to the control electrode of the driving transistor, a second electrode that is electrically connected to the second electrode of the driving transistor, and a control electrode receiving the first clock signal.

25. The scan driving circuit of claim 24, further comprising a buffer configured to supply the charging circuit with the scan start signal or the second output signal.

26. The scan driving circuit of claim 24, wherein the driving circuit comprises a driving transistor including a first electrode that receives the first clock signal, a control electrode and a second electrode, via which the first output signal is pulled up, and the holding circuit comprises a first hold transistor including a first electrode electrically connected to the control electrode of the driving transistor, a second electrode electrically connected to the second electrode of the driving transistor and a control electrode receiving the first clock signal.

27. The scan driving circuit of claim 24, wherein the driving circuit comprises a driving transistor including a first electrode that receives the first clock signal to pull up the first output signal of the present stage via a second electrode of the driving circuit,
- and wherein the holding circuit further comprises a second hold transistor including a control electrode that receives the second clock signal, a first electrode that receives the second output signal, and a second electrode that is electrically connected to the first electrode of the first hold transistor.

28. The scan driving circuit of claim 24, wherein the stage further comprises a hold controlling circuit that controls the holding circuit, when the first clock signal is in an active state.

29. The scan driving circuit of claim 28, wherein the hold controlling circuit comprises:
- a first hold transistor including a first electrode that receives the first clock signal and a control electrode that is electrically connected to the first electrode thereof;
- a second hold transistor including a first electrode that receives the first clock signal, a control electrode that is electrically connected to the second electrode of the first hold transistor, and a second electrode that is electrically connected to the holding circuit;
- a third hold transistor including a first electrode that is electrically connected to the second electrode of the first hold transistor and the control electrode of the second hold transistor, a control electrode that is electrically connected to an output terminal where the first output signal is outputted, and a second electrode receiving the first voltage; and
- a fourth hold transistor including a first electrode that is electrically connected to the second electrode of the second hold transistor and the holding circuit, a control electrode that is electrically connected to the output terminal, and a second electrode receiving the first voltage.

30. The scan driving circuit of claim 28, wherein the driving circuit comprises a driving transistor including a first electrode that receives the first clock signal and a second electrode, via which the first output signal is pulled up, and the holding circuit comprises a fifth hold transistor including a control electrode that receives the first clock signal via the hold controlling circuit, a first electrode that is electrically connected to the second electrode of the driving transistor, and a second electrode that receives the first voltage.

31. The scan driving circuit of claim 30, wherein the holding circuit further comprises a sixth hold transistor including a control electrode that receives the second clock signal, a first electrode that is electrically connected to the second electrode of the driving transistor, and a second electrode that receives the first voltage.

32. A display apparatus including a display cell array circuit that is disposed on a substrate to have a plurality of data lines and a plurality of scan lines and a shift register that includes a plurality of stages to generate a plurality of output signals in sequence, each of the stages comprising:
   a driving circuit configured to generate a first output signal of a present stage in response to a first clock signal or a second clock signal having a phase different from the first clock signal;
   a charging circuit configured to charge an electric charge in response to the scan start signal or the second output signal;
   a discharging circuit configured to discharge the electric charge charged in the charging circuit in response to a third output signal of an adjacent next stage; and
   a holding circuit configured to maintain the first output signal of the present stage within a first voltage, the holding circuit comprising a first hold transistor that maintains the first output signal within the first voltage in response to the first clock signal.

33. The display apparatus of claim 32, wherein the stage further comprises a hold controlling circuit that controls the holding circuit, when the first clock signal is in an active state.

34. The display apparatus of claim 32, wherein the holding circuit maintains the first output signal of the present stage within the first voltage, when the first or the second clock signal applied to the driving circuit is in an active state.

35. The display apparatus of claim 32, wherein the holding circuit maintains the first output signal within the first voltage to prevent a floating of the driving circuit.

36. A display apparatus comprising:
   a display cell array circuit disposed on a substrate to include a plurality of data lines and a plurality of scan lines;
   a first scan driving circuit including a shift register that has a plurality of stages to generate a plurality of output signals corresponding to the stages to the scan lines in sequence, a first stage receiving a scan staff signal, each of the output terminals being electrically connected to each of first ends of the scan lines; and
   a second scan driving circuit electrically connected to second ends of the scan lines to discharge electric charges formed by the output signals that are applied to the scan lines, the second scan driving circuit including a first hold transistor comprising:
      a first electrode electrically connected to a second end of the scan lines which corresponds to a present stage;
      a second electrode which receives a second voltage; and
      a control electrode electrically connected to a second end of the scan lines which corresponds to an adjacent next stage.

37. The display apparatus of claim 36, wherein each of the stages comprises:
   a driving circuit configured to generate a first output signal in response to a first clock signal or a second clock signal having a phase different from the first clock signal;
   a charging circuit configured to charge an electric charge in response to a scan start signal or a second output signal of an adjacent previous stage;
   a discharging circuit configured to discharge the electric charge in response to a third output signal of the adjacent next stage; and
   a holding circuit configured to maintain the first output signal within a first voltage.

38. The display apparatus of claim 37, wherein each of the stages further comprises a buffer configured to supply the driving circuit with the scan start signal or the second output signal,
   and wherein the discharging circuit comprises:
      a first discharge transistor that discharges the electric charge to the first voltage in response to the third output signal; and
      a second discharge transistor that discharges the electric charge to the first voltage in response to a fourth output signal of a last stage.

39. The display apparatus of claim 37, wherein each of the stages further comprises a buffer configured to supply the driving circuit with the scan start signal or the second output signal, and a hold controlling circuit that outputs a hold control signal when the first or the second clock signal applied to the driving circuit is in an active state,
   and wherein the holding circuit comprises:
      a first hold transistor including a first electrode that receives the first output signal, a control electrode that is electrically connected to the hold controlling circuit to receive the hold control signal, and a second electrode that receives the first voltage;
      a second hold transistor including a first electrode that receives the scan start signal or the second output signal, a control electrode that receives the second clock signal, and a second electrode that is electrically connected to a first end of the charging circuit;
      a third hold transistor including a first electrode that is electrically connected to the first end of the charging circuit, a control electrode that receives the first clock signal, and a second electrode that receives the first output signal; and
      a fourth hold transistor including a first electrode that receives the first output signal, a control electrode that receives the second clock signal, and a second electrode that receives the first voltage.

40. The display apparatus of claim 37, wherein the driving circuit comprises a first driving transistor and a second driving transistor including a first electrode that receives the first or the second clock signal applied to the driving circuit and a second electrode, via which the first output signal is pulled up, and the first driving transistor compensates a capacity of the second driving transistor.

41. The display apparatus of claim 40, wherein a size of the first driving transistor is about five times larger than that of the second driving transistor.

42. The display apparatus of claim 40, wherein the first driving transistor receives the first output signal via one of the scan lines and a first electrode of the first driving transistor so that the second voltage is discharged via a second electrode of the first driving transistor, when a control electrode of the first driving transistor is turned on.

43. The display apparatus of claim 42, wherein the second voltage is higher than the first voltage.

* * * * *